(12) United States Patent
Schmenger et al.

(10) Patent No.: US 11,817,367 B2
(45) Date of Patent: Nov. 14, 2023

(54) POWER MODULE

(71) Applicant: Siemens Aktiengesellschaft, Munich (DE)

(72) Inventors: Jens Schmenger, Forchheim (DE); Roman Kögler, Nuremberg (DE); Thomas Schwinn, Herzogenaurach (DE); Bernd Roppelt, Unterhaid (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/096,997

(22) Filed: Jan. 13, 2023

(65) Prior Publication Data
US 2023/0230894 A1    Jul. 20, 2023

(30) Foreign Application Priority Data

Jan. 17, 2022  (EP) .................... 22151767

(51) Int. Cl.
| H01L 23/367 | (2006.01) |
| H05K 7/14 | (2006.01) |
| H05K 7/20 | (2006.01) |
| H01L 23/32 | (2006.01) |

(52) U.S. Cl.
CPC ............ H01L 23/367 (2013.01); H01L 23/32 (2013.01); H05K 7/1432 (2013.01); H05K 7/209 (2013.01)

(58) Field of Classification Search
CPC ..... H01L 23/32; H01L 23/367; H05K 7/1432; H05K 7/209
See application file for complete search history.

(56) References Cited

U.S. PATENT DOCUMENTS

| 7,209,367 B2 * | 4/2007 | Nakano ............... H05K 3/3405 361/803 |
| 2014/0206151 A1 | 7/2014 | Jones |
| 2017/0316992 A1 | 11/2017 | Spann |
| 2022/0345049 A1 * | 10/2022 | Iida ........................ H02M 7/48 |

FOREIGN PATENT DOCUMENTS

| DE | 10 2013 100 700 B3 | 5/2014 |
| EP | 2 395 647 A1 | 12/2011 |
| EP | 2 467 001 A1 | 6/2012 |
| WO | WO 2022/002464 A1 | 1/2022 |

* cited by examiner

Primary Examiner — Peniel M Gumedzoe
(74) Attorney, Agent, or Firm — Henry M. Feiereisen LLC

(57) ABSTRACT

A power module includes a heat sink, a power unit formed at least partially inside the heat sink and/or on the heat sink and comprising a semiconductor element and a substrate, and a device designed to enclose the power unit and to center a control unit with respect to the power unit. The device includes a frame designed to surround the substrate at least partially, a first projecting section designed to engage in a recess or an opening of the heat sink, and a second projecting section designed to engage in a recess or an opening or a notch of the control unit and to have an outline which when viewed in cross-section is at least essentially star-shaped with at least a first leg, a second leg and a third leg.

20 Claims, 7 Drawing Sheets

POWER MODULE

CROSS-REFERENCES TO RELATED APPLICATIONS

This application claims the priority of European Patent Application, Serial No. 22151767.5, filed Jan. 17, 2022, pursuant to 35 U.S.C. 119(a(d), the disclosure of which is incorporated herein by reference in its entirety as if fully set forth herein.

BACKGROUND OF THE INVENTION

The present invention relates to a power module.

The following discussion of related art is provided to assist the reader in understanding the advantages of the invention, and is not to be construed as an admission that this related art is prior art to this invention.

Precise alignment of a power unit of a power module to a control unit, in particular a printed circuit board, is difficult. Imprecisions mean that pins cannot be positioned correctly and thus the functionality of the power module is not available, or at least not completely.

It would therefore be desirable and advantageous to provide an improved power module to obviate prior art shortcomings.

SUMMARY OF THE INVENTION

According to one aspect of the present invention, a power module includes a heat sink, a power unit formed at least partially inside the heat sink and/or on the heat sink and Including a semiconductor element and a substrate, and a device designed to enclose the power unit and to center a control unit with respect to the power unit, the device including a frame designed to surround the substrate at least partially, preferably completely, a first projecting section designed to engage in a recess or an opening of the heat sink, and a second projecting section designed to engage in a recess or an opening or a notch of the control unit and to have an outline which when viewed in cross-section is at least essentially star-shaped with at least a first leg, a second leg and a third leg.

According to another advantageous feature of the invention, the first projecting section can have an outline which is at least essentially circular in shape when viewed in cross-section. The outline of the first projecting section can also be star-shaped or cross-shaped, for example. Other shapes may also be conceivable.

A star-shaped outline can also be regarded as a Y-shaped outline.

Advantageously, the device may be made in one piece. The substrate may advantageously serve as a conductive element. The substrate can include for example an electrically conductive layer which advantageously can Include copper, and a thermally conductive layer which advantageously includes ceramic material. The thermally conductive layer is advantageously electrically insulating. On the one hand, it is designed to provide insulation and, on the other hand, to dissipate waste heat. Ceramic is advantageous in this respect, since it makes the electrical insulation particularly easy to produce.

According to another advantageous feature of the invention, the substrate can have three layers. A first layer, which faces the heat sink, can advantageously Include copper. A second layer, which is contiguous with the first layer, can advantageously include ceramic. A third layer contiguous with the second layer can advantageously include copper. The first and third layers are thus electrically conductive layers, and the second layer is thus a thermally conductive layer. The thermally conductive layer is advantageously electrically insulating.

Advantageously, the conductive element can include a semiconductor element at and/or on the third layer, advantageously a plurality of semiconductor elements.

A power unit according to the invention may be part of a converter system or a power converter system. The device replaces an existing housing and in this respect is greatly simplified in terms of design. In addition, the invention also allows a reduction in size while providing adequate and uniform cooling.

The provision of three legs is advantageous, as this ensures a high degree of stability with only a small amount of material being used. In comparison with an exemplary second projecting section typically designed as a dome or cone or cylinder, material usage is reduced significantly.

Advantageously for high temperature resistance, a plastic or resin with a high glass fiber content is used, which is very cost-intensive. Even only a small reduction in material reduces costs in this respect.

An outline in accordance with the invention, also offers the advantage that no reinforcements are required for stabilization, these otherwise being necessary in particular due to material shrinkage during cooling of a cast or injection-molded frame.

The second projecting section is reinforced by the star-shaped outline, In particular in the direction of the control unit. As a result, the second projecting section is particularly stable and less prone to misalignment. Any misalignment should be avoided, as it will result in rejects during the process of joining the power module to the control unit. The star-shaped outline is also advantageous in terms of tool costs. For example, in the case of a second projecting section that is designed as a hollow cylinder, a pin around which material is injected is required in the tool. This pin can now be dispensed with as a result of the star-shaped outline.

The star-shaped outline reduces a contact surface between the second projecting section and the control unit, thereby reducing friction occurring during joining. The joining process becomes smoother—compared to a round shape—when only three star tips (i.e. the ends of the legs, viewed radially) are in contact with the control unit.

According to another advantageous feature of the invention, the first leg and the second leg of the second projecting section can be disposed as to partially surround the outline of the first projecting section when viewed from a bird's eye perspective. This embodiment is particularly space-saving.

According to another advantageous feature of the invention, a length of the first leg of the second projecting section can be of a same length as the second leg of the second projecting section. An embodiment involving all the legs of the second projecting section being of equal length is particularly advantageous. This makes the second projecting section particularly stable.

According to another advantageous feature of the invention, the length of the first leg can be longer than a length of the third leg of the second projecting section. This embodiment can also be used for a space-saving design. The shortest leg in this case advantageously points away from the first projecting section.

According to another advantageous feature of the invention, the frame can be fixed to the heat sink by an adhesive. As no screw connection or the like is required, the heat sink, in particular the heat sink base, can be made slimmer. This also promotes a compact design of the power module.

According to another advantageous feature of the invention, the frame can be rectangular, with the first projecting section at least essentially disposed at a corner of the frame, in particular an outer corner of the frame, and with the second projecting section at least essentially disposed at a corner of the frame, in particular an outer corner of the frame. This ensures particularly accurate positioning or centering.

According to another advantageous feature of the invention, the first projecting section and the second projecting section can be made to project in opposite directions. This provides good positioning of the frame with respect to the heat sink and also good positioning of the control unit with respect to the frame.

According to another advantageous feature of the invention, the first projecting section and the second projecting section can be aligned perpendicular to a surface of the heat sink. This ensures a particularly successful joining operation.

According to another advantageous feature of the invention, the frame can include polyphenylene sulfide (PPS). PPS is advantageous, being a high-temperature-resistant thermoplastic. Advantageously, the frame may include polyphenylene sulfide with a fiber content of 50 to 75%, in particular 60 to 65%. However, other plastics can also be used.

According to another advantageous feature of the invention, an angle between the first leg and the second leg of the second projecting section can be equal to an angle between the second leg and the third leg.

A star-shaped configuration of the second projecting section with three legs evenly offset by 120° is particularly advantageous. This specific shape makes it easier to compensate for shape and position tolerances during the positioning process. More twisting of the entire power module is possible for a same hole diameter in the printed circuit board.

According to another advantageous feature of the invention, one of the three legs can have a width of between 0.5 and 2 mm, preferably between 0.8 and 1.6 mm, in particular between 1.1 and 1.3 mm. For stability reasons, a width of 1.2 mm, for example, has shown to be beneficial.

According to another advantageous feature of the invention, the power module can include a fixing element for fixing the control unit. This enables the control unit to be securely fixed. The fixing element may, for example, be a screw.

According to another aspect of the invention, a frame for a power module which includes a heat sink and a power unit formed at least partially inside the heat sink and/or on the heat sink, includes a first projecting section designed to engage in a recess or an opening of the heat sink, and a second projecting section designed to engage in a recess or an opening or a notch of the control unit and to have an outline which when viewed in cross-section is at least essentially star-shaped with at least three legs.

According to another advantageous feature of the invention, the first projecting section can have an outline which is at least essentially circular in shape, i.e. round, when viewed in cross-section According to still another aspect of the invention, a power converter includes a power module including a heat sink, a power unit formed at least partially inside the heat sink and/or on the heat sink and comprising a semiconductor element and a substrate, and a device designed to enclose the power unit and comprising a frame designed to surround the substrate at least partially, a first projecting section designed to engage in a recess or an opening of the heat sink, and a second projecting section having an outline which when viewed in cross-section is at least essentially star-shaped with at least three legs, and a control unit comprising an electronic component, wherein the power module and the control unit are interconnected.

According to another advantageous feature of the invention, the control unit can be centered with respect to the power module by engagement of the second projecting section of the power module in a recess or opening of the control unit.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
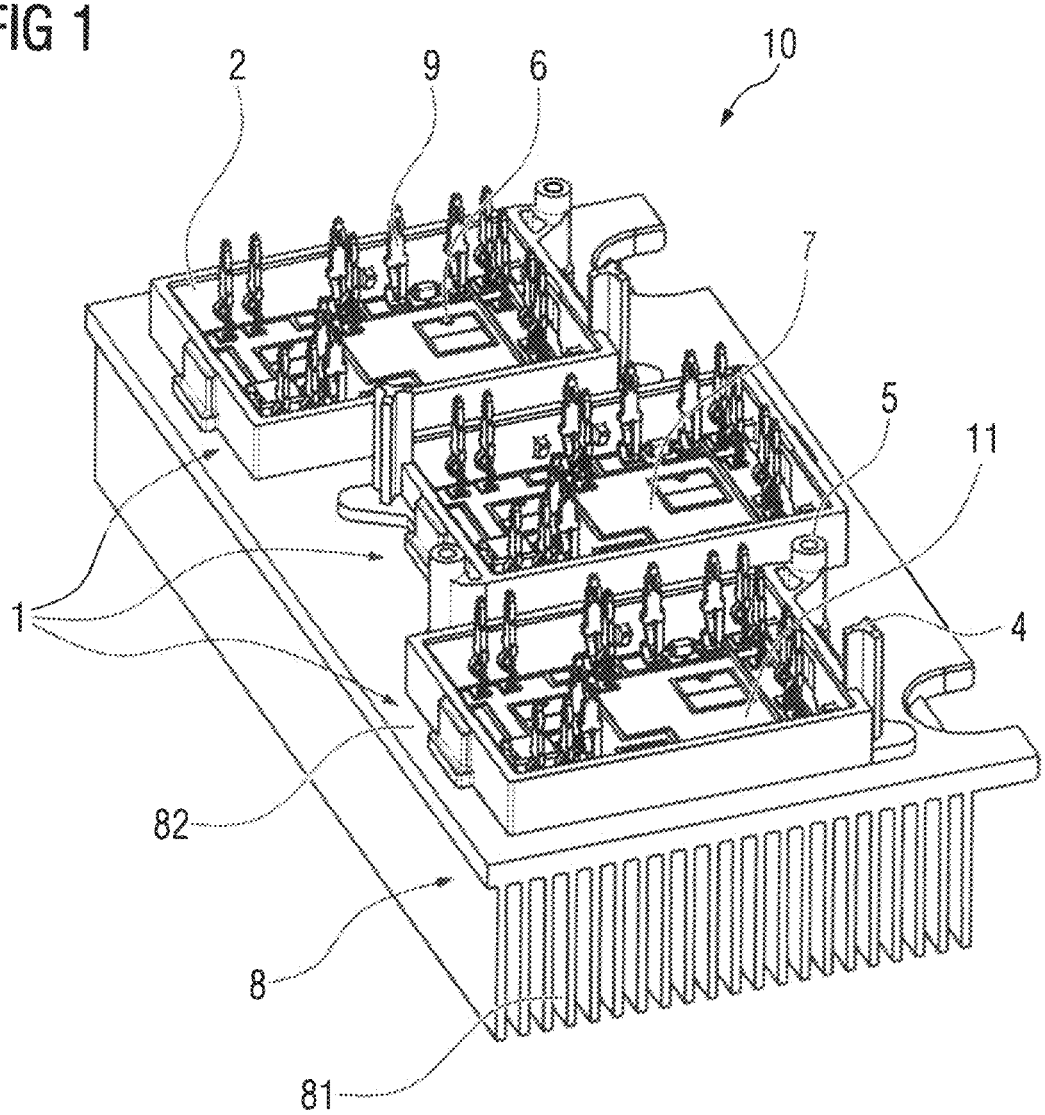
FIG. 1 is a perspective view of a power module according to the Invention.

Throughout all the figures, same or corresponding elements may generally be indicated by same reference numerals. These depicted embodiments are to be understood as Illustrative of the invention and not as limiting in any way. It should also be understood that the figures are not necessarily to scale and that the embodiments may be illustrated by graphic symbols, phantom lines, diagrammatic representations and fragmentary views. In certain instances, details which are not necessary for an understanding of the present invention or which render other details difficult to perceive may have been omitted.

Figure 3:
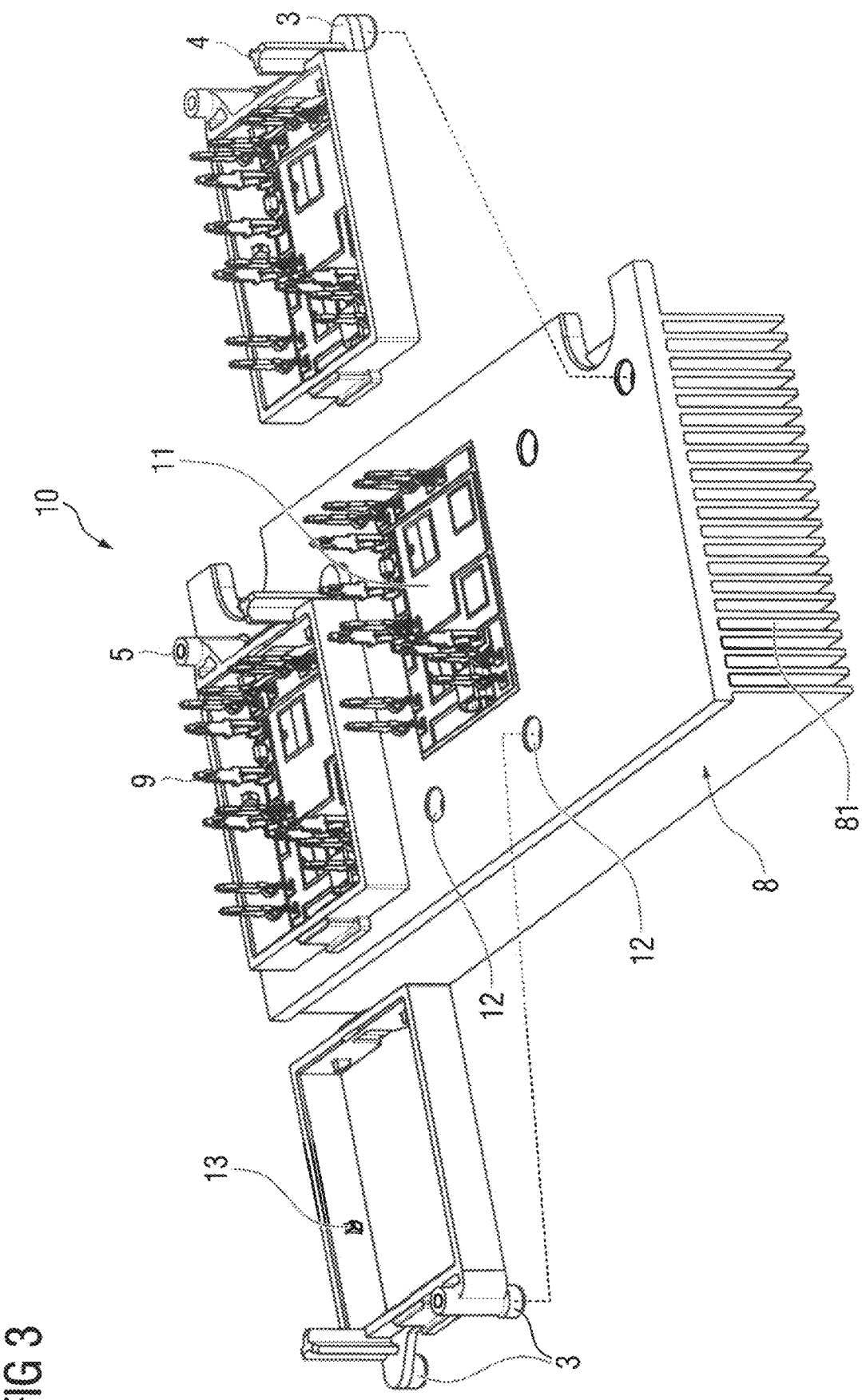
FIG. 3 is an exploded view of the power module of FIG. 1.

Turning now to the drawing, and in particular to FIG. 1, there is shown a perspective view of a power module according to the invention, generally designated by reference numeral 10. FIG. 3 shows the power module 10 by way of an exploded view. The power module 10 includes a power unit 11 implemented on the power module 10 and a device 1 which encloses the power unit 11. The power unit 11 includes at least one semiconductor element 6, which is in particular a power semiconductor, for example an IGBT. The power unit 11 further Includes a substrate 7.

The device 1 includes a frame 2, which completely surrounds the substrate 7, and at least one first projecting section 3, which engages in an opening 12 (FIG. 3) of a heat sink 8 or is designed to engage in the opening 12. The opening 12 can be configured as a notch, a recess, a blind hole or a hole, for example and is advantageously Implemented in a base 22 (or base plate) of the heat sink 8. Cooling fins 81 are disposed below the base 22 of the heat sink 8. Advantageously, the cooling fins 81 are disposed in parallel.

Figure 4:
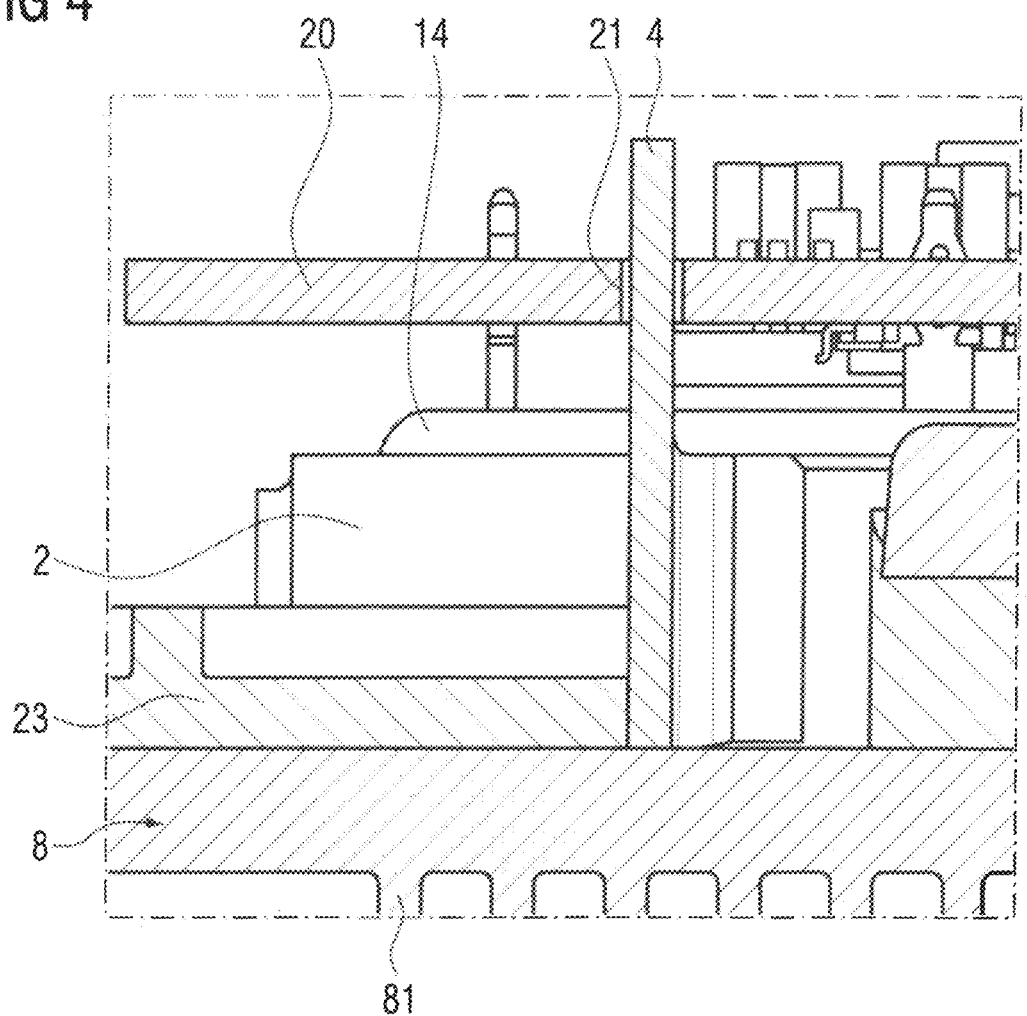
FIG. 4 is a sectional view of the power module connected to a control unit.

The device 1 further includes at least one second projecting section 4, which is designed to engage in a notch or recess or an opening 21 (FIG. 4), for example a hole, of a control unit 20 having at least one electronic component (FIG. 4). The control unit 20 is advantageously a motherboard. For fixing the control unit 20, the device 1 has a fixing element 5.

FIG. 1 also shows contacting elements 9. A contacting element 9 is preferably a pin. The power unit 11 advantageously has a plurality of contacting elements 9. The contacting elements 9 can be designed as single pins or as a multi-part pin system.

Figure 8:
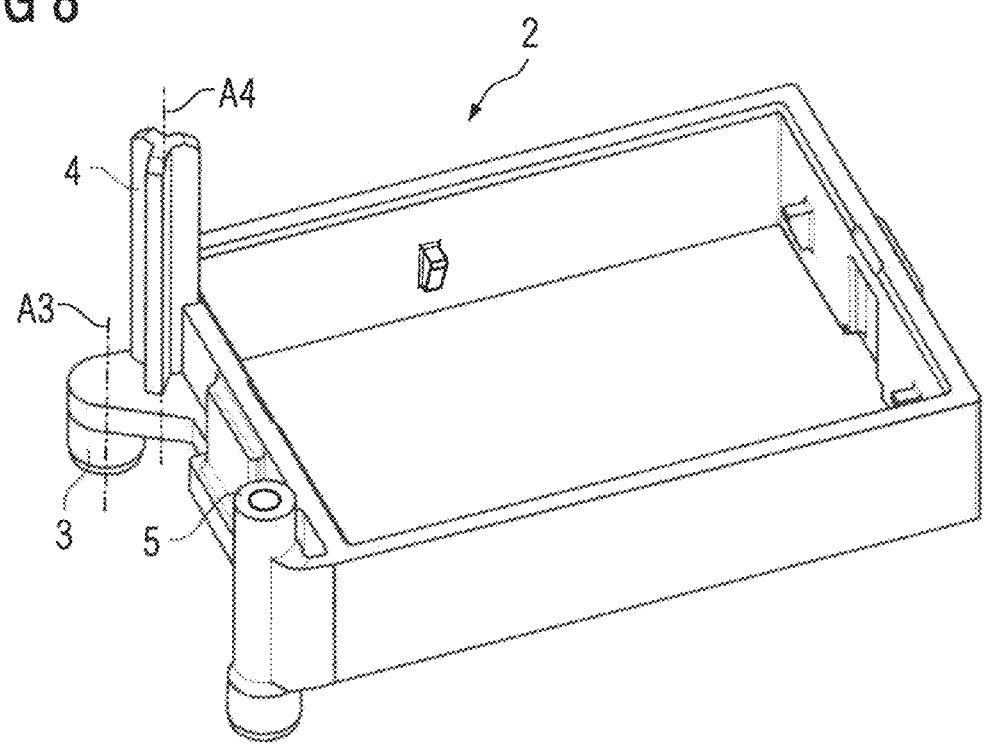
FIG. 8 is a perspective view of a frame of the power module, and FIG. 9. is a detailed illustration from above of the outline of the second projecting section of the power module.

The frame 2 is rectangular in shape, as readily apparent from FIG. 8. However, other shapes are also conceivable, such as a round frame, an oval frame, a square frame or a trapezoidal frame. The frame 2 can be fixed to the heat sink 8 by means of adhesive, for example.

FIGS. 1 and 3 show that the first projecting section 3 is disposed at least essentially at an outer corner or in the region of the outer corner of the frame 2. FIGS. 1 and 3 also show that the second projecting section 4 is disposed at least essentially at an outer corner or in the region of the outer corner of the frame 2. A diagonal arrangement with respect to one another is also conceivable. The first and second projecting sections 3, 4 are advantageously disposed at a common corner of the frame 2. Advantageously, the first and second projecting sections 3, 4 are integrally connected to one another. They are advantageously designed to project in opposite directions. They are advantageously in one piece.

The first projecting section 3 is advantageously designed as a positioning peg. In this way, precise positioning of the device 1 on a surface of the heat sink 8 is achieved. Advantageously, no form-fit and/or force-fit connection is involved. The first projecting section 3 advantageously has a shape that fits at least essentially precisely into the recess 12 or opening of the heat sink 8. The first projecting section 3 advantageously has a round cross-section. However, other shapes are also conceivable.

The second projecting section 4 is advantageously implemented as a centering dome. The outline of the second projecting section 4, viewed in cross-section, is at least essentially in the shape of a star, wherein the star has at least one first leg, second leg and third leg. This allows accurate centering of the control unit. No guide tools are required.

Figure 2:
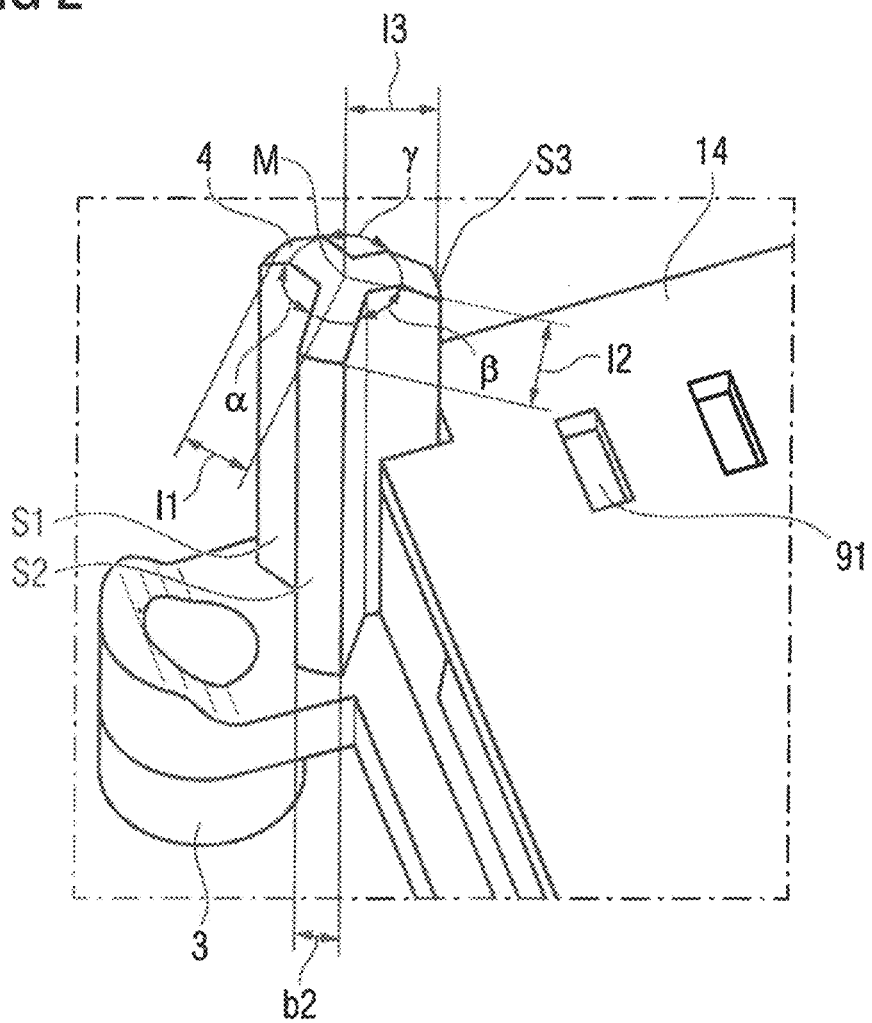
FIG. 2 is a detailed perspective view of an outline of a second projecting section of the power module of FIG. 1.
Figure 9:
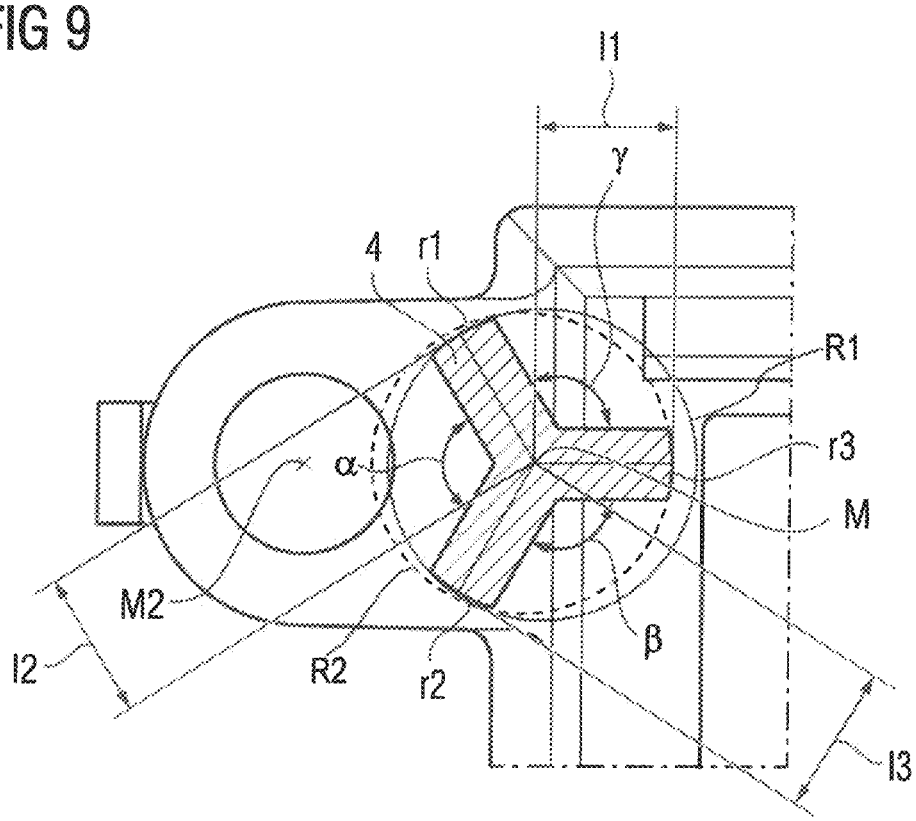

FIGS. 2 and 9 show the outlines of the first and second projecting sections 3, 4 in detail. Advantageously, the second projecting section 4 has exactly three legs S1, S2 and S3. These are disposed in a star shape (or also: in a Y-shape) around a center point M. With respect to the center point M, the following advantageously applies:

$$l1=l2=l3,$$

wherein l1 is a length of the first leg S1,
l2 is a length of the second leg S2,
l3 is a length of the third leg S3.

Advantageously, the following length dimension applies to l1: 0.5 mm≤l1≤5 mm. With particular preference: 1.5 mm≤l1≤3.5 mm. In a particularly advantageous embodiment: 2 mm≤l1≤3 mm, e.g. l1 is 2.515 mm.

Alternatively, it is also conceivable that one leg is longer than another.

Advantageously, the legs S1, S2 and S3 are disposed such that, for intervening angles α, β and γ, the following equation applies:

$$\alpha=\beta=\gamma.$$

By way of example, a leg width b2 is shown for leg S2. This is advantageously between 0.5 and 2 mm, preferably between 0.8 and 1.6 mm, in particular between 1.1 and 1.3 mm. For stability reasons, 1.2 mm, for example, is well suited.

FIG. 2 shows that the second projecting section 4 engages in a lateral notch of a cover 14. Twisting is prevented by the described arrangement of the first and second projecting sections 3, 4. FIG. 2 also shows that the cover 14 has openings 91 for pins 9 (see FIG. 1).

The frame 2 is advantageously designed such that an applied potting compound remains within an area bounded by the frame 2 and the power module 10 or a side of the power module 10. For this purpose, the frame 2 is advantageously integrally bonded, in particular adhesively, to a surface of the power module 10. Silicone is particularly suitable as a potting compound. Silicone is resistant to high temperatures. In addition, silicone solidifies at room temperature or by means of UV light. Silicone also has very good electrical insulating properties, low viscosity and good flow behavior. Other conceivable examples as a potting compound include polyurethane and/or epoxies are also conceivable.

The power unit 11 is advantageously joined to the heat sink 8. This Joint may advantageously be achieved by compression and/or soldering and/or sintering. However, other types of joints are also conceivable, in particular using other thermally conductive materials. In addition, joining by the application of thermal energy, for example welding, is also possible.

The power unit 11 can be advantageously designed as part of a power module's own heat sink. The power unit can be advantageously designed as direct copper bonded (DCB).

The power module's own heat sink advantageously incorporates the power unit 11 and contacting elements. The heat sink 8 advantageously has at least one power unit 11. However, a heat sink 8 can also comprise two or more power units 11. A heat sink 8 optimally includes three power units 11, as shown by way of example in FIG. 1. This ensures good cooling with optimum utilization in terms of performance. The provision of three power units 11 is advantageous, as one power unit 11 can be assigned to each phase of a three-phase system.

The semiconductor element 6 is, for example, a thyristor or a MOSFET or an IGBT. Other semiconductor components are also conceivable. When designing the semiconductor element 6 as an IGBT, a free-wheeling diode is also required. Other semiconductor elements are also conceivable.

The control unit 20 may, advantageously, be a power board (also termed motherboard), i.e. a printed circuit board populated with components, and can be used for control and power supply, preferably by means of DC voltage.

FIG. 3 also shows a device designed to support a cover 14. The device has, for example, a plurality of lugs 13. The cover 14 is shown in FIG. 4. The cover 14 allows the pins 9 to be guided, and the cover 14 may have recesses for this purpose. In addition, the cover 14 provides explosion protection. During performance tests, the semiconductor elements are put under demand or overloaded such that explosions may occur. The cover 14 provides environmental protection, in particular protection of the converter or more specifically power converter. For this purpose, the cover 14 includes, for example, glass-fiber-reinforced polycarbonate.

Figure 5:
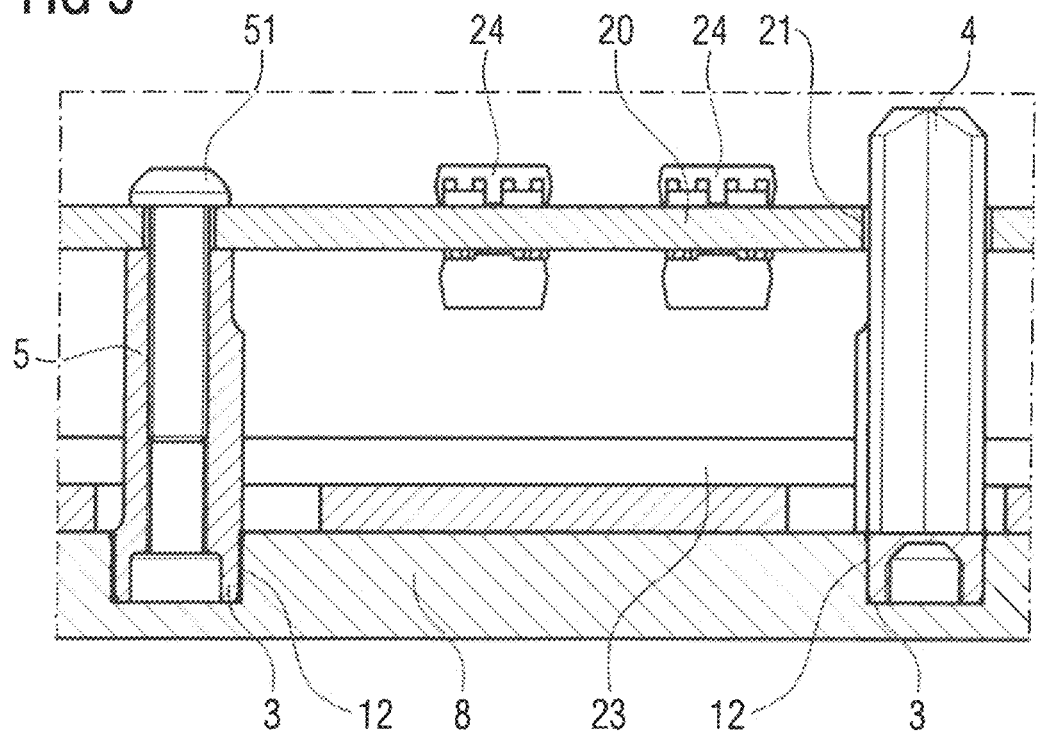
FIG. 5 is a another sectional view of the power module connected to the control unit.
Figure 7:
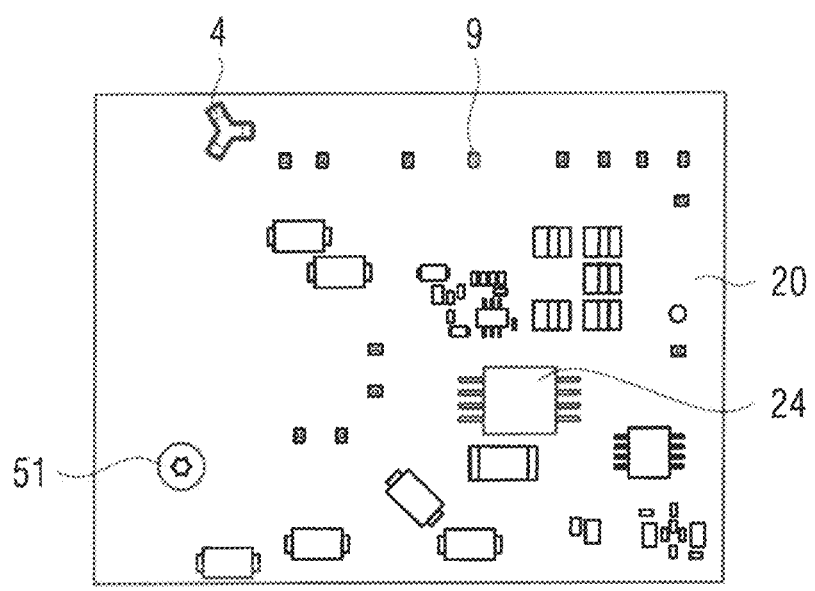
FIG. 7 is a bird's eye view of the power module connected to the control unit.

FIGS. 4 and 5 show the power module 10, which is connected to the control unit 20. FIG. 7 shows a bird's eye view of the power module 10 connected to the control unit 20. FIG. 5 also shows a plurality of electronic components 24. An electronic component 24 may be, for example, a capacitor, a resistor or a diode. Other components are also possible. The electronic components 24 preferably serve a control function.

As shown in FIG. 5, the second projecting section 4 engages in an opening 21 of the control unit 20. This ensures good centering. Also shown in FIG. 5 are a heat sink cover or retaining frame 23 and fixing element 5 used to fix the control unit 20. The fixing element 5 is advantageously designed so as to support the control unit 20. In addition, the fixing element 5 advantageously has a cavity in which, for example, a thread is provided. The advantage of this is that the control unit 20 can be fixed by a screw 51. The fixing element 5 is advantageously designed for force-fit connection and/or form-fit connection to another body. The fixing element 5 may, for example, have an internal thread which is designed to receive a body having an external thread, for example a screw. Provision of a screw is beneficial as it ensures detachability. In addition, it is possible for the fixing element 5 to have a cavity such that a thread-forming or thread-cutting screw can be fixed.

The fixing element 5 can also include the first projecting section 3, as shown in FIG. 5.

The power module 10 is advantageously part of a converter system. The converter system can be high performance and particularly be suitable for production and machine tool drives as well as in the glass and/or packaging industry. Other applications include heating, ventilation, air-conditioning, pumps and standard fans as well as various converter applications.

The invention offers the advantage of simplifying process, assembly and manufacturing steps and reducing costs, especially with regard to material usage. Much less material has to be used for the device described than for a conventional housing. The power converter is also lighter as a result.

Instead of screwing a housed power unit to the heat sink 8 and using bushings in the housing for this purpose, the device 1 described is advantageously mounted directly on the heat sink 8.

For easier positioning and to ensure against twisting, at least two pegs are advantageously provided which only engage in a hole, preferably a blind hole, of minimum depth for positioning. The depth is preferably 1 mm to 5 mm. The heat sink 8 together with the power unit 11 can be advantageously guided into the motherboard by at least one positioning peg serving as a positioning tool, thus enabling positioning.

By means of the screw 51 on the fixing element 5, a continuous mechanical connection is advantageously created from the heat sink 8 to the motherboard. This connection additionally ensures direct alignment of these component parts by means of the positioning peg, thereby promoting better design matching of the component parts.

Figure 6:
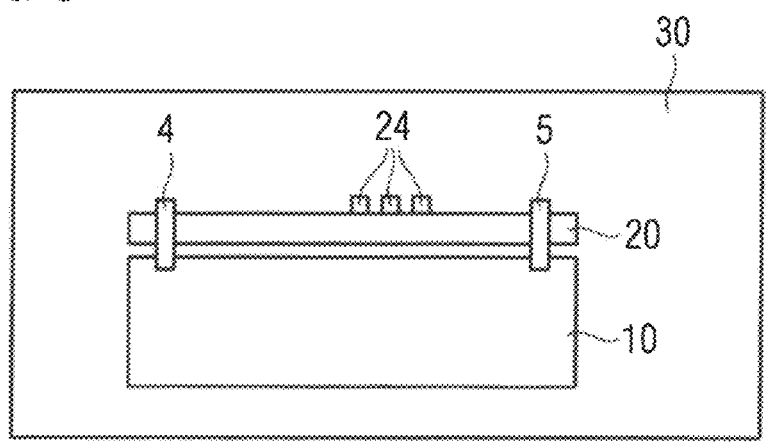
FIG. 6 is a schematic illustration of a power converter.

FIG. 6 shows a power converter 30. The power converter 30 has at least one power module 10, as described above. The power converter 30 may also have a plurality of power modules 10. The power converter 30 also has a control unit 20 having at least one electronic component 24. The power module 10 and the control unit 20 are Interconnected, as shown in the FIG. 6.

FIG. 8 shows the frame 2. The frame 2 has at least one first projecting section 3, which is designed to engage in a recess or opening 12 of the heat sink 8. The frame 2 also has a second projecting section 4, which is designed to engage in a recess or an opening or a notch 21 of the control unit 20 having at least one electronic component 24. The outline of the first projecting section 3 is at least essentially circular or round when viewed in cross-section. The outline of the second projecting section 4, when viewed in cross-section, is essentially star-shaped, wherein the star has three legs. FIG. 8 also shows longitudinal axes A3 and A4 which extend through center points M2 and M, respectively. The first and second sections 3 and 4 do not lie on a common longitudinal axis but rather lie on different longitudinal axes A3 and A4.

FIG. 9 shows the outline of the second projecting section 4 in detail. The legs S1, S2 and S3 (FIG. 2) of the second projecting section 4 have rounded ends r1, r2 and r3, respectively, and describe a notional rounding R2. R2 is a circle in FIG. 9. The rounding R2 is a measure for the second projecting section 4 (also termed Y-peg or Y-body). R2 can be regarded as corresponding to a round peg having the same diameter as the second Y-body.

For example, rounding R1 corresponds to a hole or opening 21 in the control unit 20. This is advantageously slightly larger than the rounding R2.

If the two peg variants are shifted horizontally, a Y-outline contacts this hole later than a round one. Shown here is the contact of the edges of the Y-legs with the hole, and to the left of this the round outline lying outside is visible. The advantage of this is that the Y-outline shown gives more clearance before a collision occurs than in the case of a round outline.

While the invention has been illustrated and described in connection with currently preferred embodiments shown and described in detail, it is not intended to be limited to the details shown since various modifications and structural changes may be made without departing in any way from the spirit and scope of the present Invention. The embodiments were chosen and described in order to explain the principles of the invention and practical application to thereby enable a person skilled in the art to best utilize the invention and various embodiments with various modifications as are suited to the particular use contemplated.

What is claimed is:

1. A power module, comprising:
   a heat sink;
   a power unit formed at least partially inside the heat sink and/or on the heat sink and comprising a semiconductor element and a substrate; and
   a device designed to enclose the power unit and to center a control unit with respect to the power unit, said device comprising a frame designed to surround the substrate at least partially, preferably completely, a first projecting section designed to engage in a recess or an opening of the heat sink, and a second projecting section designed to engage in a recess or an opening or a notch of the control unit and to have an outline which when viewed in cross-section is at least essentially star-shaped with at least a first leg, a second leg and a third leg.

2. The power module of claim 1, wherein the first projecting section has an outline which is at least essentially circular in shape when viewed in cross-section, the first leg and the second leg of the second projecting section being disposed such as to partially surround the outline of the first projecting section when viewed from a bird's eye perspective.

3. The power module of claim 1, wherein the first leg has a length which corresponds to a length of the second leg.

4. The power module of claim 3, wherein the length of the first leg is longer than a length of the third leg of the second projecting section.

5. The power module of claim 1, wherein the frame is fixed to the heat sink by an adhesive.

6. The power module of claim 1, wherein the frame is rectangular, with the first projecting section at least essentially disposed at a corner of the frame, in particular an outer corner of the frame, and with the second projecting section at least essentially disposed at a corner of the frame, in particular an outer corner of the frame.

7. The power module of claim 1, wherein the first projecting section and the second projecting section project in opposite directions.

8. The power module of claim 1, wherein the first projecting section and the second projecting section are oriented perpendicular to a surface of the heat sink.

9. The power module of claim 1, wherein the frame includes polyphenylene sulfide.

10. The power module of claim 1, wherein an angle between the first leg and the second leg of the second projecting section is equal to an angle between the second leg and the third leg.

11. The power module of claim 1, wherein one of the first leg, second leg, and third leg is defined by a width between 0.5 and 2 mm, preferably between 0.8 and 1.6 mm, in particular between 1.1 and 1.3 mm.

12. The power module of claim 1, further comprising a fixing element designed to fix the control unit.

13. A frame for a power module which includes a heat sink and a power unit formed at least partially inside the heat sink and/or on the heat sink, said frame comprising:
    a first projecting section designed to engage in a recess or an opening of the heat sink; and
    a second projecting section designed to engage in a recess or an opening or a notch of a control unit and to have an outline which when viewed in cross-section is at least essentially star-shaped with at least three legs.

14. The frame of claim 13, wherein the first projecting section has an outline which is at least essentially circular in shape when viewed in cross-section, wherein a first one of the three legs and a second one of the three legs are disposed such as to partially surround the outline of the first projecting section when viewed from a bird's eye perspective.

15. The frame of claim 13, wherein a first one of the three legs of the second projecting section has a length which corresponds to a length of a second one of the three legs of the second projecting section.

16. The frame of claim 13, wherein a first one of the three legs of the second projecting section has a length which is longer than a length of a third one of the three legs.

17. The frame of claim 13, wherein the first projecting section and the second projecting section project in opposite directions.

18. The frame of claim 13, wherein an angle between a first one of the three legs of the second projecting section and a second one of the three legs of the second projecting section is equal to an angle between the second one of the three legs and a third one of the three leg of the second projecting section.

19. A power converter, comprising:
    a power module comprising a heat sink, a power unit formed at least partially inside the heat sink and/or on the heat sink and comprising a semiconductor element and a substrate, and a device designed to enclose the power unit and comprising a frame designed to surround the substrate at least partially, a first projecting section designed to engage in a recess or an opening of the heat sink, and a second projecting section having an outline which when viewed in cross-section is at least essentially star-shaped with at least three legs; and
    a control unit comprising an electronic component,
    wherein the power module and the control unit are interconnected.

20. The power converter of claim 19, wherein the control unit is centered with respect to the power module by engagement of the second projecting section of the power module in a recess or opening of the control unit.

* * * * *